(12) United States Patent
Ouyang et al.

(10) Patent No.: US 10,861,706 B2
(45) Date of Patent: Dec. 8, 2020

(54) ETCH SELECTIVITY IMPROVED BY LASER BEAM

(71) Applicant: Taiwan Semiconductor Manufacturing Co., Ltd., Hsinchu (TW)

(72) Inventors: Christine Y Ouyang, Hsinchu (TW); Li-Te Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 84 days.

(21) Appl. No.: 16/171,875

(22) Filed: Oct. 26, 2018

(65) Prior Publication Data

US 2020/0135483 A1 Apr. 30, 2020

(51) Int. Cl.
*H01L 21/308* (2006.01)
*H01L 21/268* (2006.01)
*H01L 21/033* (2006.01)
*H01L 29/66* (2006.01)
*H01L 29/78* (2006.01)
*H01L 21/02* (2006.01)

(52) U.S. Cl.
CPC ...... *H01L 21/3086* (2013.01); *H01L 21/0228* (2013.01); *H01L 21/0337* (2013.01); *H01L 21/268* (2013.01); *H01L 29/66545* (2013.01); *H01L 29/66795* (2013.01); *H01L 29/7851* (2013.01)

(58) Field of Classification Search
CPC combination set(s) only.
See application file for complete search history.

(56) References Cited

U.S. PATENT DOCUMENTS

2017/0073812 A1* 3/2017 Sundaram .............. C23C 16/56
2017/0200728 A1* 7/2017 Huang .................. H01L 21/311

* cited by examiner

*Primary Examiner* — Ratisha Mehta
(74) *Attorney, Agent, or Firm* — Birch, Stewart, Kolasch & Birch, LLP

(57) ABSTRACT

A method for forming a semiconductor structure is provided. The method includes forming a first layer over a semiconductor substrate. The first layer is made of a first material. The method also includes forming a second layer over the first layer. The second layer is made of a second material that is different from the first material. The second layer has a first opening exposing a portion of a top surface of the first layer. The method also includes heating the first layer and the second layer with a laser beam, depositing a third layer over the second layer and covering a sidewall of the first opening, and etching the first layer through the first opening to form a second opening in the first layer.

20 Claims, 16 Drawing Sheets ns, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithographic and etching processes to form circuit components and elements thereon.

Although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
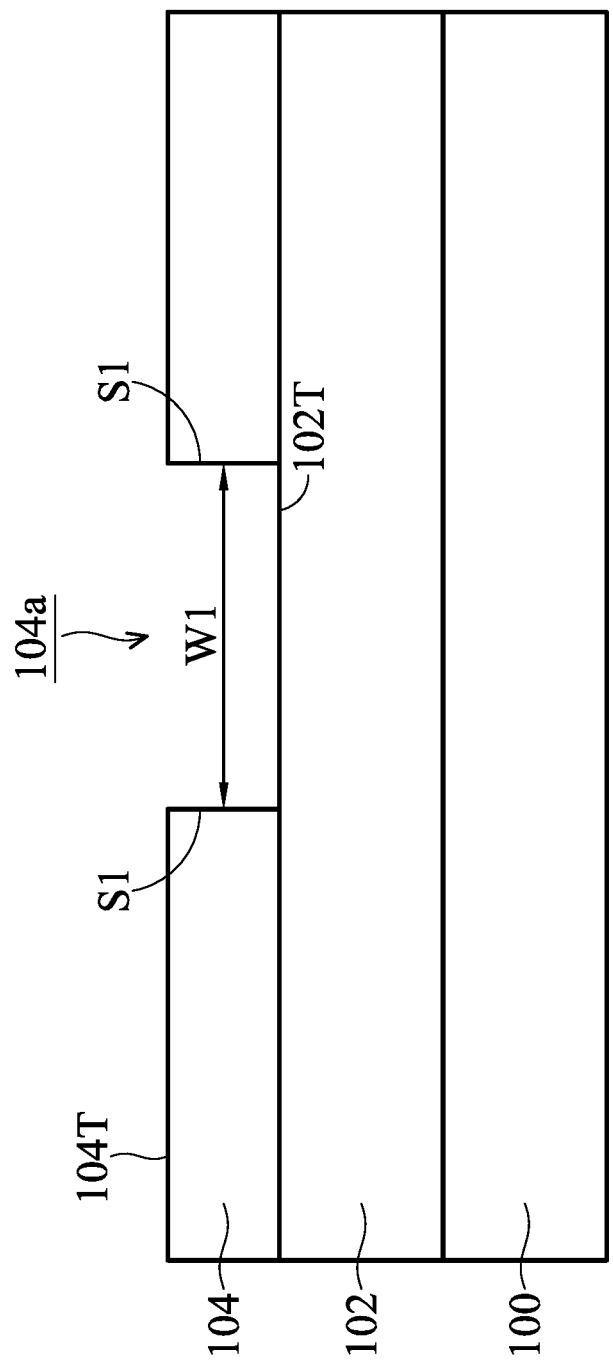
FIGS. 1A, 1B, 1C and 1D are a series of cross-sectional views illustrating various stages of a method for forming a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Fin structures described below may be patterned by any suitable method. For example, the fins may be patterned using one or more lithographic processes, including double-patterning or multi-patterning processes. Generally, double-patterning or multi-patterning processes combine lithographic and self-aligned processes, allowing patterns to be created that have, for example, pitches smaller than what is otherwise obtainable using a single, direct lithographic process. For example, in one embodiment, a sacrificial layer is formed over a substrate and patterned using a lithographic process. Spacers are formed alongside the patterned sacrificial layer using a self-aligned process. The sacrificial layer is then removed, and the remaining spacers may then be used to pattern the fins.

Embodiments of methods for forming semiconductor structures are provided. The method for forming semiconductor structure may include forming a first layer and a second layer on a semiconductor substrate, and the first layer and the second layer may be made of different materials. The method may also include heating the first layer and the second layer with a laser beam, and forming a third layer over the heated first layer and the second layer, so that an etch selectivity between the first layer and the second layer in a subsequent etching process may be increased.

FIGS. 1A, 1B, 1C and 1D are cross-sectional representations of various stages of a method for forming a semiconductor structure, in accordance with some embodiments of the present disclosure.

A semiconductor substrate 100 is provided, as shown in FIG. 1A in accordance with some embodiments. The semiconductor substrate 100 may be a semiconductor wafer such as a silicon wafer. Alternatively or additionally, the semiconductor substrate 100 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the semiconductor substrate 100 includes an epitaxial layer. For example, the semiconductor substrate 100 may have an epitaxial layer overlying a bulk semiconductor. In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable process, or a combination thereof.

Various active elements (not shown) may be formed in and/or over the semiconductor substrate 100. Examples of the various active elements include transistors, diodes, another applicable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs). In some embodiments, the semiconductor substrate 100 includes a fin field effect transistor (FinFET). Various passive elements (not shown) may be formed in and/or over the semiconductor substrate 100. Examples of the various passive elements include capacitors, inductors, resistors, another applicable passive element, or a combination thereof. Various processes, such as front-end-of-line (FEOL) semiconductor fabrication processes, may be performed to form the various active elements and passive elements. The FEOL semiconductor fabrication processes may include deposition, etching, implantation, lithographic, annealing, planarization, one or more other applicable processes, or a combination thereof.

In some embodiments, isolation features (not shown) are formed in the semiconductor substrate 100. The isolation features may be used to define active regions and electrically isolate various elements formed in and/or over the semiconductor substrate 100 in the active regions. In some embodiments, the isolation features include shallow trench isolation (STI) features, local oxidation of silicon (LOCOS) features, other suitable isolation features, or a combination thereof.

Afterwards, a first layer 102 is formed over the semiconductor substrate 100, and a second layer 104 is formed over the first layer 102, as shown in FIG. 1A in accordance with some embodiments. In some embodiments, the first layer 102 is made of a first material, and the second layer 104 is made of a second material that is different from the first material.

The first layer 102 and the second layer 104 are made of different dielectric materials in accordance with some embodiments. In some embodiments, one of the first layer 102 and the second layer 104 is made of an oxide (e.g., silicon oxide and metal oxide), and the other one of the first layer 102 and the second layer 104 is made of a nitride (e.g., silicon nitride).

In some embodiments, one of the first layer 102 and the second layer 104 is made of a semiconductor material (e.g., silicon), and the other one of the first layer 102 and the second layer 104 is made of a dielectric material (e.g., silicon oxide, silicon nitride, and metal oxide). In some embodiments, one of the first layer 102 and the second layer 104 is made of a metal (e.g., aluminum (Al), copper (Cu), tungsten (W), titanium (Ti), and tantalum (Ta)), and the other one of the first layer 102 and the second layer 104 is made of a dielectric material (e.g., silicon oxide, silicon nitride, and metal oxide).

In some embodiments, the first layer 102 is an interlayer dielectric (ILD) layer and the second layer 104 is a mask layer (e.g., a hard mask layer) for patterning the first layer 102. For example, the interlayer dielectric layer may be made of silicon oxide, silicon oxynitride, tetraethoxysilane, phosphosilicate glass (PSG), borophosphosilicate glass (BPSG), fluorosilicate glass (FSG), hydrogen silsesquioxane (HSQ), other applicable dielectric materials, or a combination thereof. For example, the mask layer may be made of silicon nitride, other applicable dielectric materials, or a combination thereof.

For example, the first layer 102 and the second layer 104 may be formed by a chemical vapor deposition (CVD) process (e.g., a high-density plasma chemical vapor deposition (HDPCVD) process, an atmospheric pressure chemical vapor deposition (APCVD) process, a low-pressure chemical vapor deposition (LPCVD) process, and a plasma enhanced chemical vapor deposition (PECVD) process), a spin-on coating process, a physical vapor deposition process (e.g., a sputtering process, and an evaporation process), an atomic layer deposition process, another applicable process, or a combination thereof.

Afterwards, a first opening 104a is formed in the second layer 104, as shown in FIG. 1A in accordance with some embodiments. In some embodiments, the second layer 104 having the first opening 104a is used as an etch mask in a subsequent etching process to etch the first layer 102, and the details will be discussed in the following paragraphs. The first opening 104a may have a width W1 as shown in FIG. 1A. The first opening 104a may have sidewalls S1, and the sidewalls S1 may also be considered as sidewalls of the second layer 104. A portion of a top surface 102T of the first layer 102 is exposed by the first opening 104a of the second layer 104, as shown in FIG. 1A in accordance with some embodiments.

The first opening 104a may be formed by a patterning process. The patterning process may include a lithographic process, an etching process, other applicable processes, or a combination thereof. The lithographic process may include photoresist coating (e.g., spin-on coating), soft baking, mask aligning, exposure, post-exposure baking, developing the photoresist, rinsing and drying (e.g., hard baking). The etching process may include a dry etching process, a wet etching process, or a combination thereof.

Figure 1B:
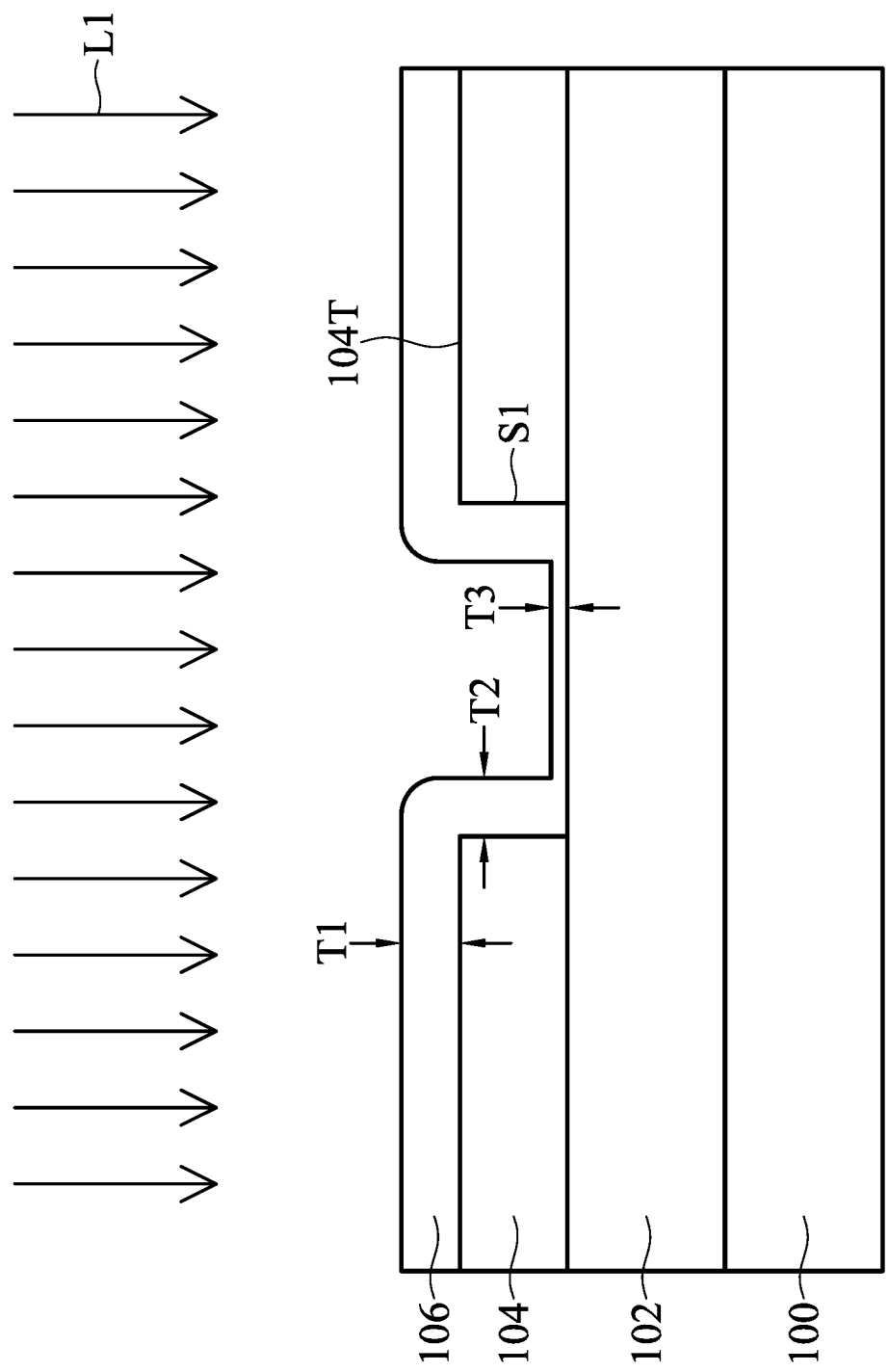

Afterwards, a third layer 106 is formed over the second layer 104 and the first layer 102, as shown in FIG. 1B in accordance with some embodiments. The third layer 106 covers a top surface 104T of the second layer 104, the sidewalls S1 of the second layer 104, and the portion of the top surface 102T of the first layer 102 exposed by the first opening 104a, as shown in FIG. 1B in accordance with some embodiments. In some embodiments, the third layer 106 covers the top surface 104T and the sidewalls S1 of the second layer 104, and the portion of the top surface 102T of the first layer 102 exposed by the first opening 104a is at least partially exposed by the third layer 106.

In some embodiments, the third layer 106 is made of a dielectric material. For example, the dielectric material may be silicon oxide, silicon nitride, other applicable dielectric materials, or a combination thereof. In some embodiments, the third layer 106 is made of an organic material, an organometallic material, or a combination thereof.

The third layer 106 is formed by a deposition process in accordance with some embodiments. The deposition process for depositing the third layer 106 may be performed in a deposition chamber. In some embodiments, the third layer 106 is deposited on the first layer 102 and the second layer 104 by an atomic layer deposition process performed in a deposition chamber. In some embodiments, since the third layer 106 is deposited by an atomic layer deposition process, a growth rate of the third layer 106 on the top surface 104T of the second layer 104 and a growth rate of the third layer 106 on the sidewall S1 of the second layer 104 are substantially the same, and thus the occurrence of the third layer 106 clogging at the top of the first opening 104a due to uneven growth rate of the third layer 106 can be reduced. In these embodiments, the thickness T1 of the third layer 106 on the top surface 104T of the second layer 104 is substantially the same as the thickness T2 of the third layer 106 on the sidewall S1 of the second layer 104 (e.g., the ratio of the thickness T1 to the thickness T2 may be in a range from about 0.8 to about 1.2).

In some embodiments, the third layer 106 is deposited on the first layer 102 and the second layer 104 by a molecular layer deposition (MLD) process performed in a deposition chamber.

A laser beam L1 is applied to heat the first layer 102 and the second layer 104, as shown in FIG. 1B in accordance with some embodiments. For example, the first layer 102 and the second layer 104 may be heated by scanning the first layer 102 and the second layer 104 with the laser beam L1. The laser beam L1 may be perpendicular to the top surface 104T of the second layer 104 or have any appropriate tilt angle according to design requirements. For example, the wavelength of the laser beam L1 may be in a range from about 600 nm to about 1000 nm.

The first layer 102 and the second layer 104 are heated with the laser beam L1 in the deposition chamber in which the third layer 106 is deposited, in accordance with some embodiments. In some embodiments, the first layer 102 and the second layer 104 are heated by the laser beam L1 while the third layer 106 is deposited on the first layer 102 and the second layer 104 by the deposition process (e.g., an atomic layer deposition process).

In accordance with some embodiments, the first layer 102 is heated by the laser beam L1 to a first temperature A1, and the second layer 104 is heated by the laser beam L1 to a second temperature A2, which is different from the first temperature A1. In some embodiments where the third layer 106 is deposited by an atomic layer deposition process, the second layer 104 is heated by the laser beam L1 to the second temperature A2, which is appropriate for the atomic layer deposition process (e.g., in a range from about 200° C. to about 600° C.). When the second temperature A2 is too low or too high, the atomic layer deposition of the third layer 106 on the top surface 104T and the sidewalls S1 of the second layer 104 may not occur. In some embodiments, since the second layer 104 is heated by the laser beam L1 to the second temperature A2 appropriate for the atomic layer deposition process, the film qualities and the deposition rates of the third layer 106 on the top surface 104T and the sidewalls S1 of the second layer 104 can be improved and the manufacturing time of the third layer 106 can be reduced.

In some embodiments, since the second layer 104 is heated to the second temperature A2 appropriate for the deposition process of the third layer 106, the quality of the third layer 106 on the top surface 104T and the sidewalls S1 of the second layer 104 can be improved. For example, the defects and impurities in the third layer 106 may be reduced, the density of the third layer 106 may be increased, and/or the uniformity of the third layer 106 may be improved.

The laser absorption coefficient C1 of the first material of the first layer 102 with respect to the laser beam L1 is different from the laser absorption coefficient C2 of the second material of the second layer 104 with respect to the laser beam L1, in accordance with some embodiments. In some embodiments, since the laser absorption coefficient C1 is different from the laser absorption coefficient C2, the first layer 102 is heated by the laser beam L1 to the first temperature A1 and the second layer 104 is heated by the laser beam L1 to the second temperature A2, which is different from the first temperature A1.

In some embodiments where the laser absorption coefficient C2 is greater than the laser absorption coefficient C1, the second temperature A2 is greater than the first temperature A1, and thus the growth rate of the third layer 106 on the top surface 104T of the second layer 104 and the growth rate of the third layer 106 on the sidewall S1 of the second layer 104 are greater than a growth rate of the third layer 106 on the portion of the top surface 102T of the first layer 102 exposed by the first opening 104a. In these embodiments, the thickness T1 of the third layer 106 on the top surface 104T is greater than the thickness T3 of the third layer 106 on the portion of the top surface 102T exposed by the first opening 104a, and the thickness T2 of the third layer 106 on the sidewalls S1 is also greater than the thickness T3 of the third layer 106 on the portion of the top surface 102T exposed by the first opening 104a. In some embodiments, the quality of the third layer 106 on the top surface 104T and the sidewalls S1 is better than the third layer 106 on the portion of the top surface 102T exposed by the first opening 104a.

Since the thickness of the third layer 106 on the second layer 104 (e.g., T1, T2, or both) may be greater than the thickness of the third layer 106 on the portion of the top surface 102T exposed by the first opening 104a (e.g., T3), an etch selectivity between the first layer 102 and the second layer 104 in a subsequent etching process may be increased. The details will be discussed in the following paragraphs.

In some embodiments, the difference between the second temperature A2 and the first temperature A1 is greater than 100° C. (e.g., in a range from about 100° C. to about 300° C.). When the difference between the second temperature A2 and the first temperature A1 is too small, the difference between the thickness of the third layer 106 on the second layer 104 and the thickness of the third layer 106 on the first layer 102 may not be great enough, and an etch selectivity between the first layer 102 and the second layer 104 in a subsequent etching process may not be sufficiently increased.

Figure 1C:
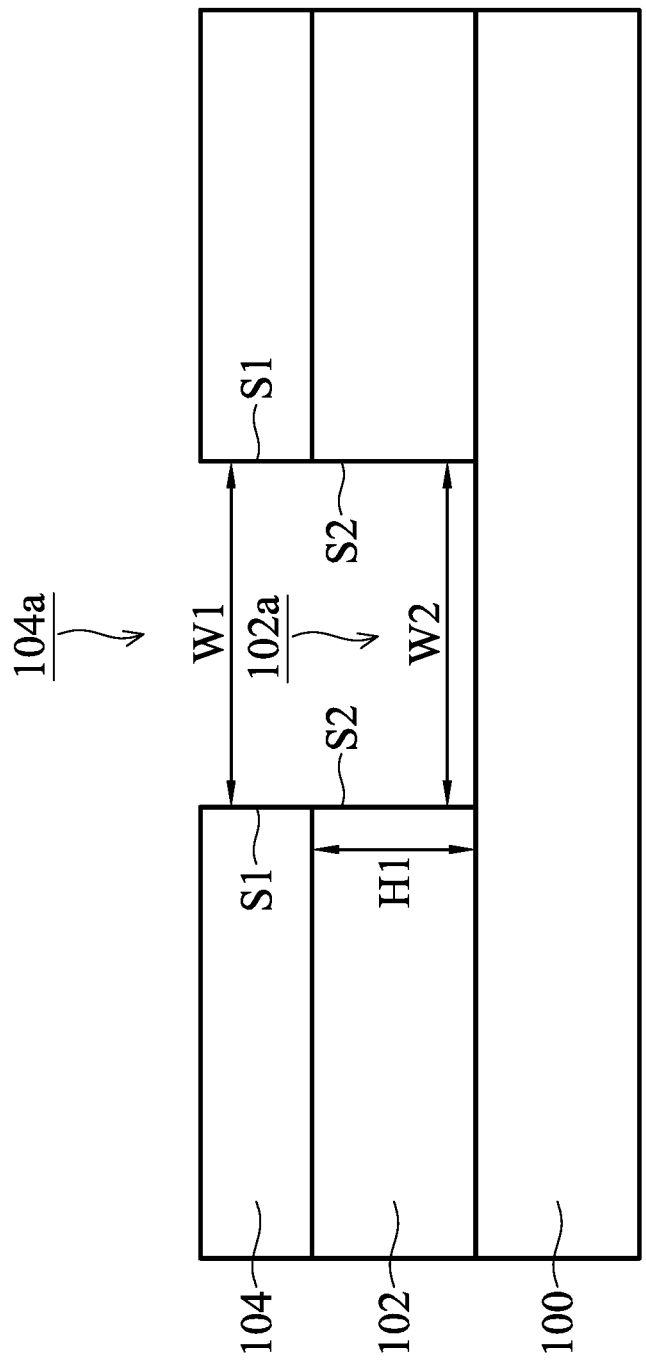

Afterwards, the first layer 102 is etched through the first opening 104a to form a second opening 102a in the first layer 102, as shown in FIG. 1C in accordance with some embodiments. The second opening 102a may have a width W2 and a height H1, as shown in FIG. 1C. The second opening 102a may have sidewalls S2, and the sidewalls S2 may also be considered as sidewalls of the first layer 102. A portion of a top surface of the semiconductor substrate 100 is exposed by the second opening 102a of the first layer 102, as shown in FIG. 1C in accordance with some embodiments.

The second opening 102a is formed by an etching process, in accordance with some embodiments. The etching process may be a dry etching process (e.g., a plasma etching process), a wet etching process, or a combination thereof. The third layer 106 and a portion of the first layer 102 exposed by the first opening 104a are removed by the etching process to form the second opening 102a in the first layer 102, in accordance with some embodiments.

In some embodiments, the thickness of the third layer 106 on the second layer 104 (e.g., T1, T2, or both) is greater than the thickness of the third layer 106 on the portion of the top surface 102T exposed by the first opening 104a (e.g., T3), and thus the time for removing (e.g., by an etching process) the third layer 106 on the second layer 104 is greater than the time for removing the third layer 106 on the portion of the top surface 102T exposed by the first opening 104a. Therefore, the ratio of the etch rate of the second layer 104 to the etch rate of the first layer 102 in the etching process for forming the second opening 102a may be decreased, and thus the etch selectivity between the first layer 102 and the second layer 104 in the etching process for forming the second opening 102a may be increased. In some embodiments, the ratio of the thickness of the third layer 106 on the portion of the top surface 102T exposed by the first opening 104a (e.g., T3) to the thickness of the third layer 106 on the second layer 104 (e.g., T1, T2, or both) may be in a range from about 0.01 to about 0.5.

In some embodiments, since the etch selectivity between the first layer 102 and the second layer 104 in the etching process for forming the second opening 102a is increased, the width W2 of the second opening 102a of which the aspect ratio (i.e., H1/W2) is high can be substantially the same as the width W1 of the first opening 104a. For example, the ratio of the width W1 to the width W2 may be in a range from about 0.8 to about 1.2.

Since the etch selectivity between the first layer 102 and the second layer 104 in the etching process for forming the second opening 102a may be increased, the profile of the first opening 104a may be well transferred to the second opening 102a. For example, in some embodiments, the sidewalls S2 of the second opening 102a are substantially aligned with the sidewalls S1 of the first opening 104a, as shown in FIG. 1C.

The first layer 102 is etched to form the second opening 102a in the deposition chamber, in which the third layer 106 is deposited and the first layer 102 and the second layer 104 are heated by the laser beam L1, in accordance with some embodiments. In these embodiments, the deposition chamber of the deposition process for depositing the third layer 106 is also used as the etching chamber of the etching process for etching the first layer 102. In some embodiments, since the deposition process for depositing the third layer 106 and the etching process for etching the first layer 102 are performed in the same chamber, the time for forming the second opening 102a can be reduced and the capacity can be increased.

In some embodiments, the deposition of the third layer 106 and the etching of the first layer 102 are repeated for many times (e.g. twice, three times, or other appropriate times) according to design needs. For example, the third layer 106 may be deposited on the first layer 102 and the second layer 104 by a first deposition process (e.g., an atomic layer deposition process). Then, at least a portion of the third layer 106 and a portion of the first layer 102 may be removed to form an opening having a height less than H1 in the first layer 102 by a first etching process (e.g., a plasma etching process). Then, another third layer 106 may be deposited on the first layer 102 and the second layer 104 by a second deposition process (e.g., an atomic layer deposition process). Then, at least a portion of the another third layer 106 and a portion of the first layer 102 may be removed to form the second opening 102a having the height H1 in the first layer 102 by a second etching process (e.g., a plasma etching process).

A deposition of the third layer 106 followed by an etching of the first layer 102 may be referred to as a deposition-etching cycle. In some embodiments where the second opening 102a is formed by repeating (e.g. for twice, three times, or other appropriate times) the deposition-etching cycle, the parameters of each cycle (except for the first cycle) can be adjusted according to the results (e.g., the resulting profile of the opening) of the previous cycle, and thus the profile of the second opening 102a can be well controlled. The deposition-etching cycles are performed in the same chamber, in accordance with some embodiments. In some embodiments, the thickness of each third layer 106 formed on the second layer 104 by each deposition-etching cycle may be less than 3 nm (e.g., in a range from about 0.5 nm to about 2 nm). When a third layer 106 formed on the second layer 104 by a corresponding deposition-etching cycle is too thick, it may be hard to control the profile of the second opening 102a.

Figure 1D:
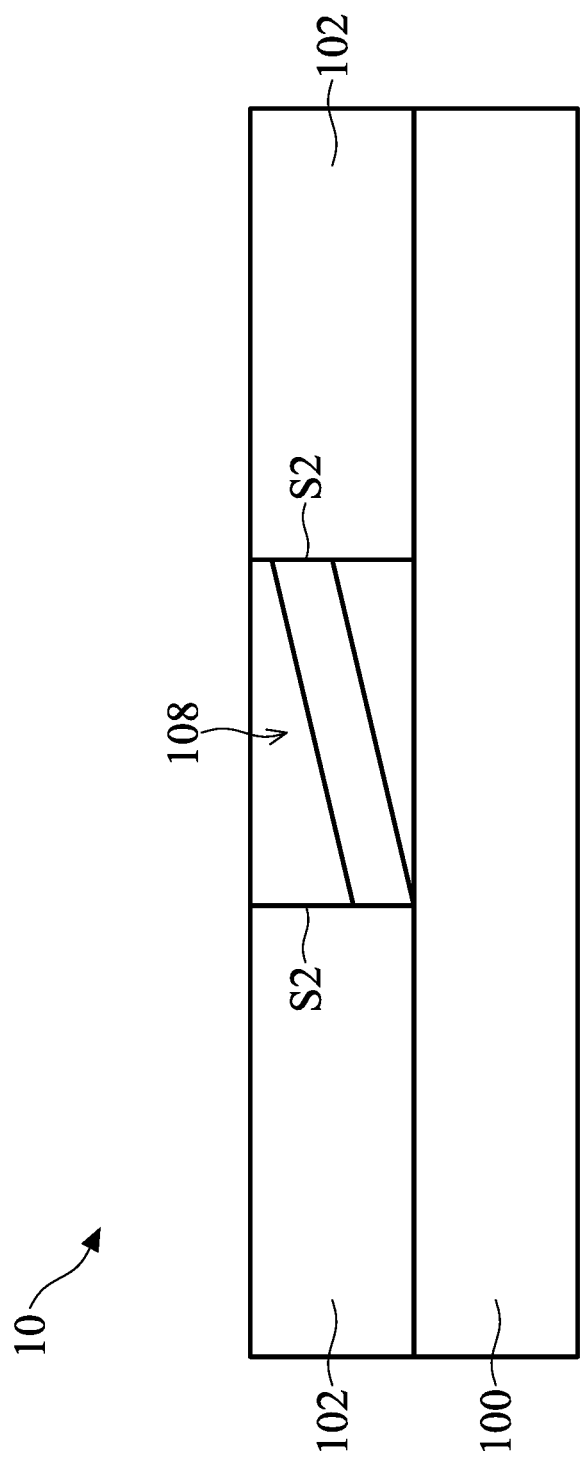

Afterwards, a structure 108 is formed in the second opening 102a to form a semiconductor structure 10, as shown in FIG. 1D in accordance with some embodiments. In some embodiments, the second opening 102a is filled with a third material to form the structure 108 in the second opening 102a. In some embodiments, the structure 108 is a contact, a via, or other conductive structures. In some embodiments, the third material of the structure 108 is tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), other applicable materials, or a combination thereof. In some embodiments, a physical vapor deposition process, an atomic layer deposition process, a plating process, a chemical vapor deposition process, or other applicable processes are used to deposit the third material, and then the second layer 104 and the third material outside the second opening 102a are removed by an applicable process (e.g., a chemical mechanical polishing process) while the third material inside the second opening 102a is left to serve as the structure 108.

In some embodiments, a barrier layer and/or an adhesion layer (not shown in the figures) may optionally be formed over the bottom surface and the sidewalls S2 of the second opening 102a before the deposition of the third material. The barrier layer and/or the adhesion layer may serve as part of the structure 108. In some embodiments, the barrier layer and the adhesion layer are made of tantalum (Ta), tantalum nitride (TaN), titanium (Ti), titanium nitride (TiN), cobalt tungsten (CoW), other applicable materials, or a combination thereof. In some embodiments, the barrier layer and the adhesion layer are formed by a deposition process, such as a chemical vapor deposition process, a physical vapor deposition process, an atomic layer deposition process, a plating process, other applicable deposition processes, or a combination thereof.

Figure 2A:
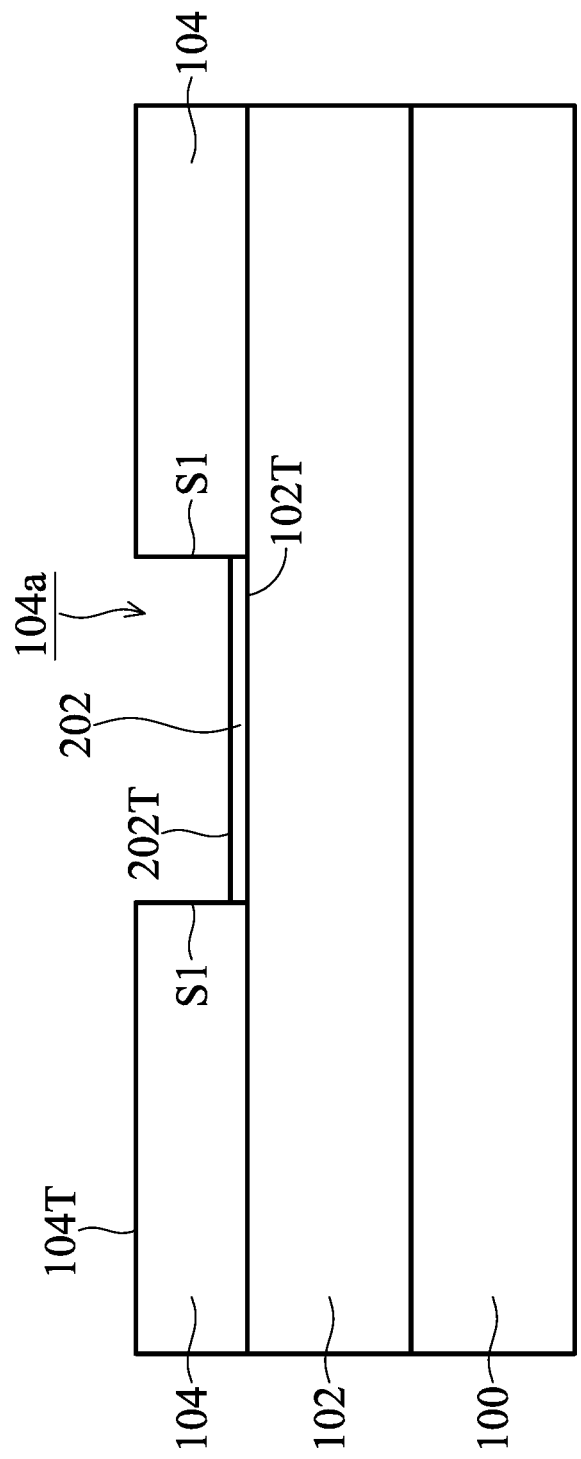
FIGS. 2A and 2B are a series of cross-sectional views illustrating various stages of a method for forming a semiconductor structure in accordance with some embodiments.
Figure 2B:
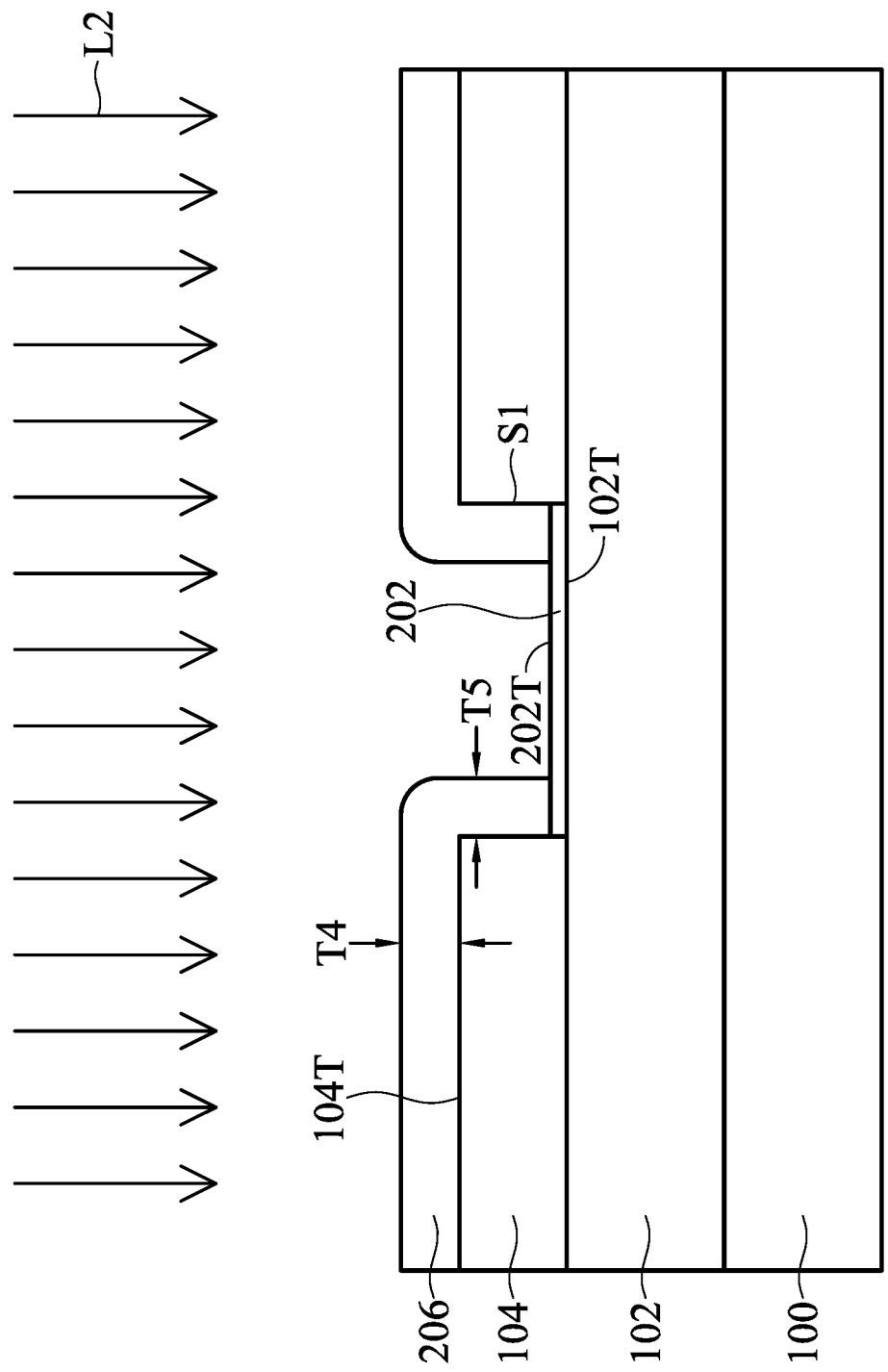

FIGS. 2A and 2B are cross-sectional representations of various stages of a method for forming a semiconductor structure, in accordance with some embodiments of the present disclosure. One difference between the method illustrated by FIGS. 1A to 1D and the method illustrated by FIGS. 2A to 2B is that a blocking layer is formed on the top surface of the first layer in the method illustrated by FIGS. 2A to 2B.

A structure including the semiconductor substrate 100, the first layer 102, and the second layer 104 having the first opening 104a is provided, as shown in FIG. 2A in accordance with some embodiments. The materials and the forming methods of the semiconductor substrate 100, the first layer 102, and the second layer 104 having the first opening 104a illustrated in FIG. 2A are the same as or similar to those of the semiconductor substrate 100, the first layer 102, and the second layer 104 having the first opening 104a illustrated in FIG. 1A. In the interests of simplicity, the details will not be discussed again.

Afterwards, a blocking layer 202 is formed on the portion of the top surface 102T exposed by the first opening 102a, as shown in FIG. 2A in accordance with some embodiments. In some embodiments, the blocking layer 202 includes self-assembled monolayers. For example, the self-assembled monolayers of the blocking layer 202 may be made of thiols, silanes, phosphonates, other applicable materials, or a combination thereof. In some embodiments, the blocking layer 202 includes polymer brushes. The blocking layer 202 may be formed by a vapor deposition process, other applicable processes, or a combination thereof.

The blocking layer 202 may have a top surface 202T exposed by the first opening 104a, as shown in FIG. 2A. In some embodiments, a hydrophobicity of the top surface 202T of the blocking layer 202 is greater than a hydrophobicity of the top surface 104T of the second layer 104 and a hydrophobicity of the sidewall S1 of the second layer 104.

Afterwards, a layer 206 is formed on the second layer 104, as shown in FIG. 2B in accordance with some embodiments. In accordance with some embodiments, the layer 206 covers the top surface 104T and the sidewalls S1 of the second layer 104, and the top surface 202T of the blocking layer 202 is at least partially exposed by the layer 206, as shown in FIG. 2B.

The materials and the forming methods of the layer 206 may be the same as or similar to those of the third layer 106 illustrated in FIG. 1B. In the interests of simplicity, the details will not be discussed again.

The layer 206 is formed by a deposition process performed in a deposition chamber in accordance with some embodiments. In some embodiments, the layer 206 is deposited on the first layer 102 by an atomic layer deposition process in a deposition chamber. In some embodiments, since the layer 206 is deposited by an atomic layer deposition process, a growth rate of the layer 206 on the top surface 104T of the second layer 104 and a growth rate of the layer 206 on the sidewall S1 of the second layer 104 are substantially the same, which may prevent the layer 206 from clogging at the top of the first opening 104a due to uneven growth rate of the layer 206. In these embodiments, the thickness T4 of the layer 206 on the top surface 104T of the second layer 104 is substantially the same as the thickness T5 of the layer 206 on the sidewall S1 of the second layer 104 (e.g., the ratio of the thickness T4 to the thickness T5 may be in a range from about 0.8 to about 1.2).

A laser beam L2 having a wavelength (e.g., the wavelength of the laser beam L2 is in a range from about 600 nm to about 1000 nm) is applied to heat the first layer 102 and the second layer 104, as shown in FIG. 2B in accordance with some embodiments.

The first layer 102 and the second layer 104 are heated with the laser beam L2 in the deposition chamber in which the deposition process for the layer 206 is performed, in accordance with some embodiments. In some embodiments, the layer 206 is deposited (e.g., by an atomic layer deposition process) on the second layer 104 in the deposition chamber while the first layer 102 and the second layer 104 are heated by the laser beam L2 in the deposition chamber.

In accordance with some embodiments, the first layer 102 is heated by the laser beam L2 to a temperature A3, and the second layer 104 is heated by the laser beam L2 to a temperature A4, which is different from the temperature A3. In some embodiments where the layer 206 is deposited by an atomic layer deposition process, the second layer 104 is heated by the laser beam L2 to the temperature A4, which is appropriate for the atomic layer deposition process for the layer 206 (e.g., in a range from about 200° C. to about 600° C.). When the temperature A4 is too high or too low, the atomic layer deposition of the layer 206 on the second layer 104 may not occur. In some embodiments, since the second layer 104 is heated by the laser beam L2 to the temperature A4 appropriate for the atomic layer deposition process for the layer 206, the deposition rate and film quality of the layer 206 on the top surface 104T and the sidewalls S1 of the second layer 104 can be improved and the manufacturing time of the layer 206 can be reduced.

In some embodiments, since the second layer 104 is heated to the second temperature A4 appropriate for the deposition process of the layer 206, the quality of the layer 206 on the top surface 104T and the sidewalls S1 of the second layer 104 can be improved. For example, the defects and impurities in the layer 206 may be reduced, the density of the layer 206 may be increased, and/or the uniformity of the layer 206 may be improved The laser absorption coefficient C3 of the first material of the first layer 102 with respect to the laser beam L2 is different from the laser absorption coefficient C4 of the second material of the second layer 104 with respect to the laser beam L2, in accordance with some embodiments. In some embodiments, since the laser absorption coefficient C3 is lower than the laser absorption coefficient C4, the temperature A3 is lower than the temperature A4.

In some embodiments, the hydrophobicity of the top surface 202T of the blocking layer 202 is greater than the hydrophobicity of the top surface 104T of the second layer 104 and the hydrophobicity of the sidewalls S1 of the second layer 104, and the layer 206 is made of a material (e.g., oxides, nitrides, organometallic compounds, other applicable materials, or a combination thereof) with precursors that tend to form on a more hydrophilic surface. Therefore, in these embodiments, the layer 206 is formed on the top surface 104T and the sidewalls S1 of the second layer 104, while at least a portion of the top surface 202T of the blocking layer 202 is exposed by the layer 206.

In some embodiments, the top surface 104T and the sidewalls S1 of the second layer 104 are covered by the layer 206, and at least a portion of the top surface 202T of the blocking layer 202 is exposed by the layer 206, and thus an etch selectivity between the first layer 102 and the second layer 104 in a subsequent etching process can be increased.

Afterwards, methods and materials that are the same as or similar to those discussed with respect to FIGS. 1C and 1D are applied to form the second opening 102a and the structure 108 in accordance with some embodiments. In the interests of simplicity, the details will not be discussed again.

In some embodiments, the etching process for forming the second opening 102a also removes the blocking layer 202. In some embodiments, since the top surface 104T and the sidewalls S1 of the second layer 104 are covered by the layer 206, and the portion of the top surface 102T exposed by the first opening 104a is at least partially exposed by the layer 206, the ratio of the etch rate of the second layer 104 to the etch rate of the first layer 102 in the etching process for forming the second opening 102a can be decreased, and the etch selectivity between the first layer 102 and the second layer 104 in the etching process for forming the second opening 102a can be increased.

Figure 3A:
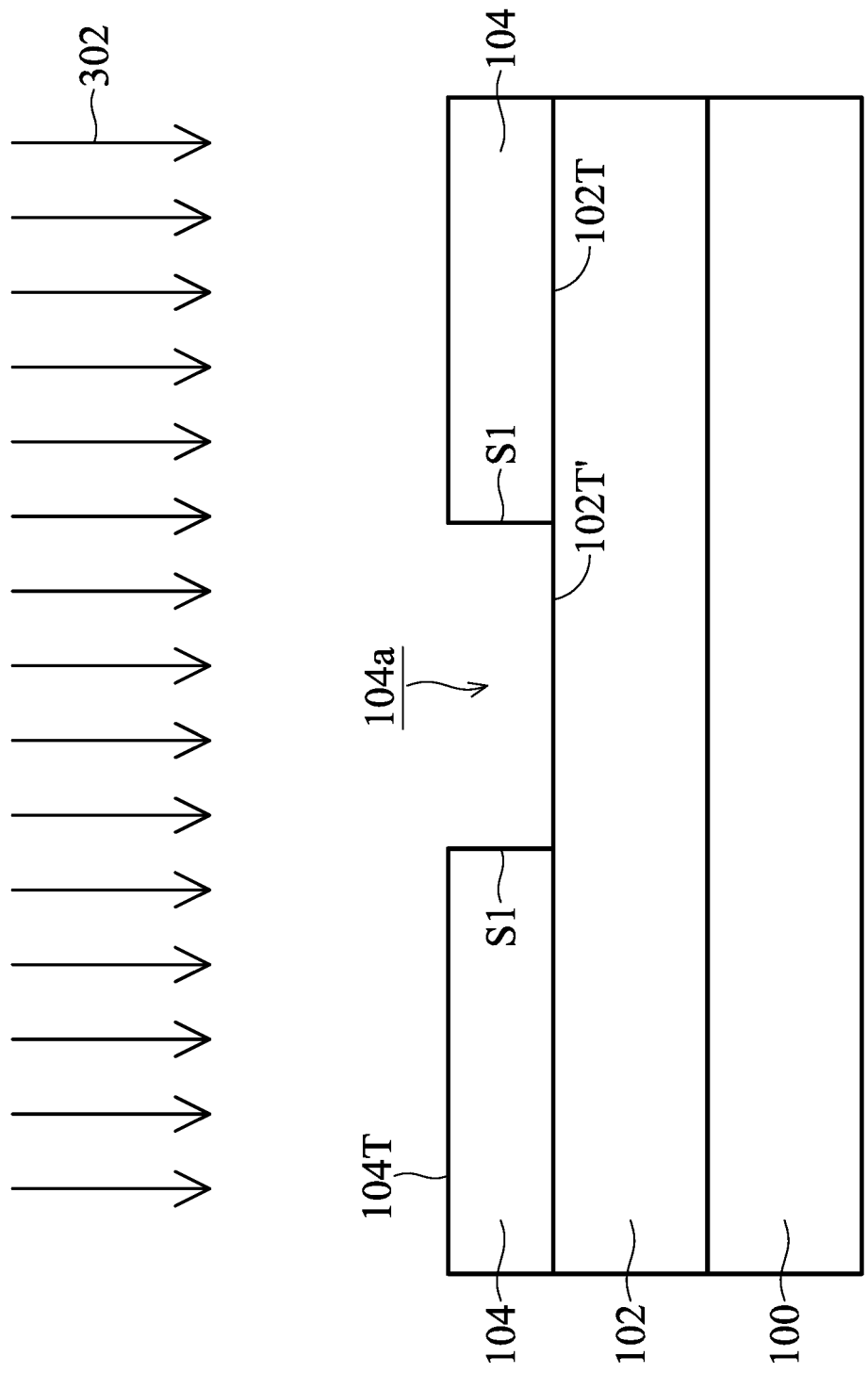
FIGS. 3A and 3B are a series of cross-sectional views illustrating various stages of a method for forming a semiconductor structure in accordance with some embodiments.
Figure 3B:
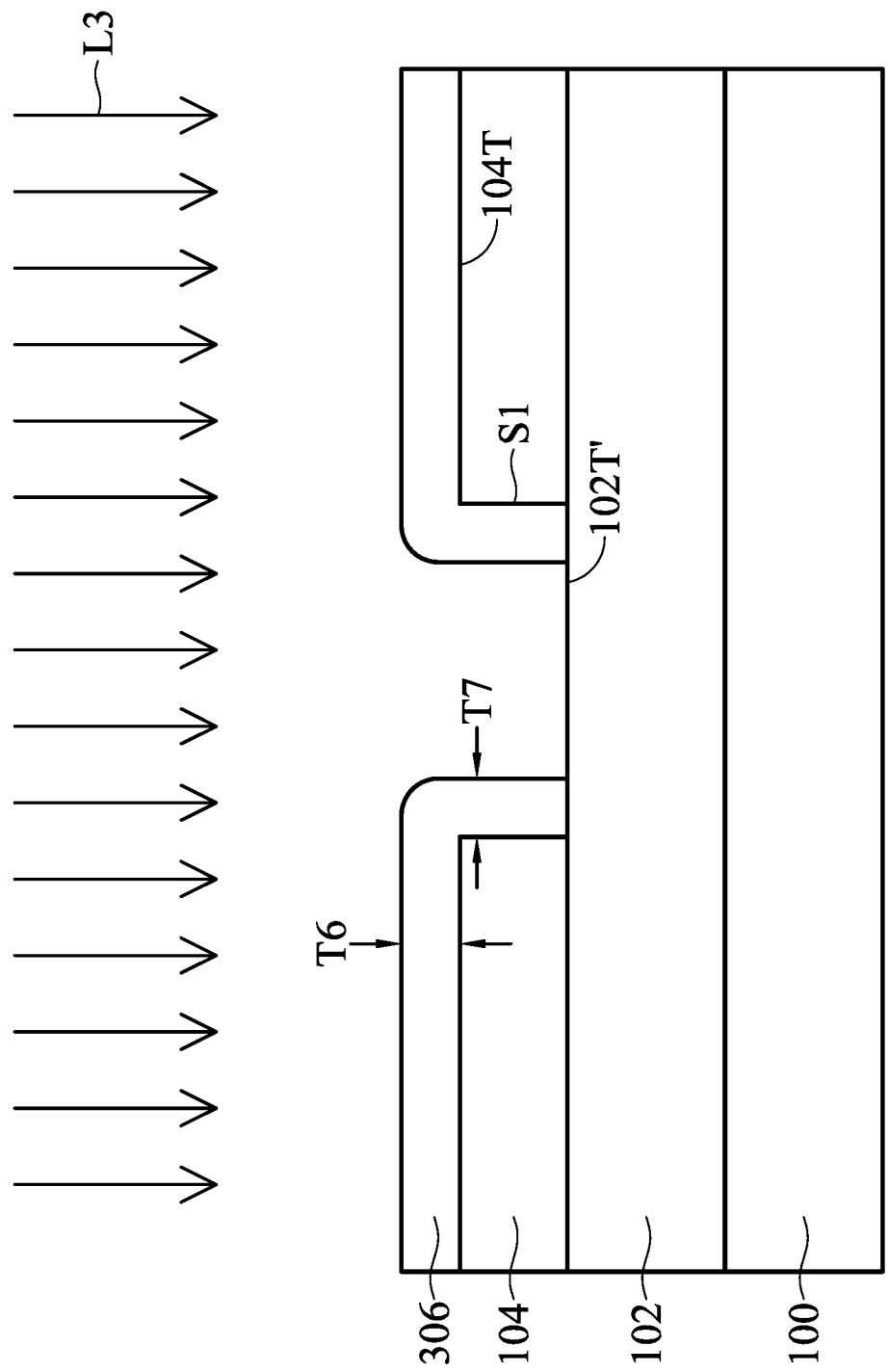

FIGS. 3A and 3B are cross-sectional representations of various stages of a method for forming a semiconductor structure, in accordance with some embodiments of the present disclosure. One difference between the method illustrated by FIGS. 1A to 1D and the method illustrated by FIGS. 3A to 3B is that a surface treatment is applied to modify the top surface of the first layer in the method illustrated by FIGS. 3A to 3B.

A structure including the semiconductor substrate 100, the first layer 102, and the second layer 104 having the first opening 104a is provided, as shown in FIG. 3A in accordance with some embodiments. The materials and the forming methods of the semiconductor substrate 100, the first layer 102, and the second layer 104 having the first opening 104a illustrated in FIG. 3A are the same as or similar to those of the semiconductor substrate 100, the first layer 102, and the second layer 104 having the first opening 104a illustrated in FIG. 1A. In the interests of simplicity, the details will not be discussed again.

Afterwards, a surface treatment 302 is performed, in accordance with some embodiments. The surface treatment 302 modifies the properties (e.g., hydrophobicity) of the portion of the top surface 102T exposed by the first opening 104a to form a modified portion 102T' of the top surface 102T in accordance with some embodiments. In some embodiments, the surface treatment 302 increases a hydrophobicity of the portion of the top surface 102T exposed by the first opening 104a to form the modified portion 102T' of the top surface 102T. In some embodiments, the hydrophobicity of the modified portion 102T' of the top surface 102T is greater than the hydrophobicity of the top surface 104T and the hydrophobicity of the sidewalls S1. For example, the surface treatment 302 may include a plasma treatment process, a silylation process, other applicable processes, or a combination thereof.

Afterwards, a layer 306 is formed on the second layer 104, as shown in FIG. 3B in accordance with some embodiments. The layer 306 covers the top surface 104T and the sidewalls S1 of the second layer 104, and the modified portion 102T' of the top surface 102T is at least partially exposed by the layer 306, as shown in FIG. 3B in accordance with some embodiments.

The materials and the forming methods of the layer 306 may be the same as or similar to those of the third layer 106 illustrated in FIG. 1B. In the interests of simplicity, the details will not be discussed again.

The layer 306 is deposited in a deposition chamber in accordance with some embodiments. In some embodiments, the layer 306 is deposited on the first layer 102 by an atomic layer deposition process performed in a deposition chamber. In some embodiments, since the layer 306 is deposited by an atomic layer deposition process, a growth rate of the layer 306 on the top surface 104T of the second layer 104 and a growth rate of the layer 306 on the sidewalls S1 of the second layer 104 are substantially the same, and thus the occurrence of the layer 306 clogging at the top of the first opening 104a due to uneven growth rate of the layer 306 can be reduced. In these embodiments, the thickness T6 of the layer 306 on the top surface 104T of the second layer 104 is substantially the same as the thickness T7 of the layer 306 on the sidewalls S1 of the second layer 104 (e.g., the ratio of the thickness T6 to the thickness T7 may be in a range from about 0.8 to about 1.2).

A laser beam L3 having a wavelength (e.g., the wavelength of the laser beam L3 is in a range from about 600 nm to about 1000 nm) is applied to heat the first layer 102 and the second layer 104, as shown in FIG. 3B in accordance with some embodiments.

The first layer 102 and the second layer 104 are heated with the laser beam L3 in the deposition chamber in which the deposition process for the layer 306 is performed, in accordance with some embodiments. In some embodiments, the first layer 102 and the second layer 104 are heated by the laser beam L3 during the deposition process (e.g., an atomic layer deposition process) for depositing the layer 306.

The laser beam L3 heats the first layer 102 to a temperature A5 and heats the second layer 104 to a temperature A6 different from the temperature A5 in accordance with some embodiments. In some embodiments where the layer 306 is deposited by an atomic layer deposition process, the laser beam L3 heats the second layer 104 to the temperature A6 appropriate for the atomic layer deposition process (e.g., in a range from about 200° C. to about 600° C.). When the temperature A6 is too low or too high, the atomic layer deposition of the layer 306 may not occur. In some embodiments, since the laser beam L3 heats the second layer 104 to the temperature A6 appropriate for the atomic layer deposition process for the layer 306, the quality and the deposition rate of the layer 306 on the top surface 104T and the sidewalls S1 of the second layer 104 can be improved and the manufacturing time of the layer 306 can be reduced.

In some embodiments, since the laser beam L3 heats the second layer 104 to the second temperature A6 appropriate for the deposition process of the layer 306, the quality of the layer 306 on the second layer 104 can be improved.

In some embodiments, the hydrophobicity of the modified portion 102T' of the top surface 102T is greater than the hydrophobicity of the top surface 104T of the second layer 104 and the hydrophobicity of the sidewalls S1 of the second layer 104, and the layer 306 is made of oxides, nitrides, organometallic compounds with precursors that tend to form on a more hydrophilic surface. Therefore, in these embodiments, the layer 306 is formed on the top surface 104T and the sidewalls S1 of the second layer 104, while the modified portion 102T' of the top surface 102T is at least partially exposed by the layer 306.

In some embodiments, the top surface 104T and the sidewalls S1 of the second layer 104 are covered by the layer 306, and the modified portion 102T' of the top surface 102T is at least partially exposed by the layer 306, and thus an etch selectivity between the first layer 102 and the second layer 104 in a subsequent etching process can be increased.

Afterwards, methods and materials that are the same as or similar to those discussed with respect to FIGS. 1C and 1D are applied to form the second opening 102a and the structure 108 in accordance with some embodiments. In the interests of simplicity, the details will not be discussed again.

In some embodiments, since the top surface 104T and the sidewalls S1 of the second layer 104 are covered by the layer 306, and the modified portion 102T' of the top surface 102T is at least partially exposed by the layer 306, the ratio of the etch rate of the second layer 104 to the etch rate of the first layer 102 in the etching process for forming the second opening 102a can be decreased, and the etch selectivity between the first layer 102 and the second layer 104 in the etching process for forming the second opening 102a can be increased.

FIGS. 4A to 4H are perspective representations of various stages of forming a FinFET structure, in accordance with some embodiments of the disclosure.

Figure 4A:
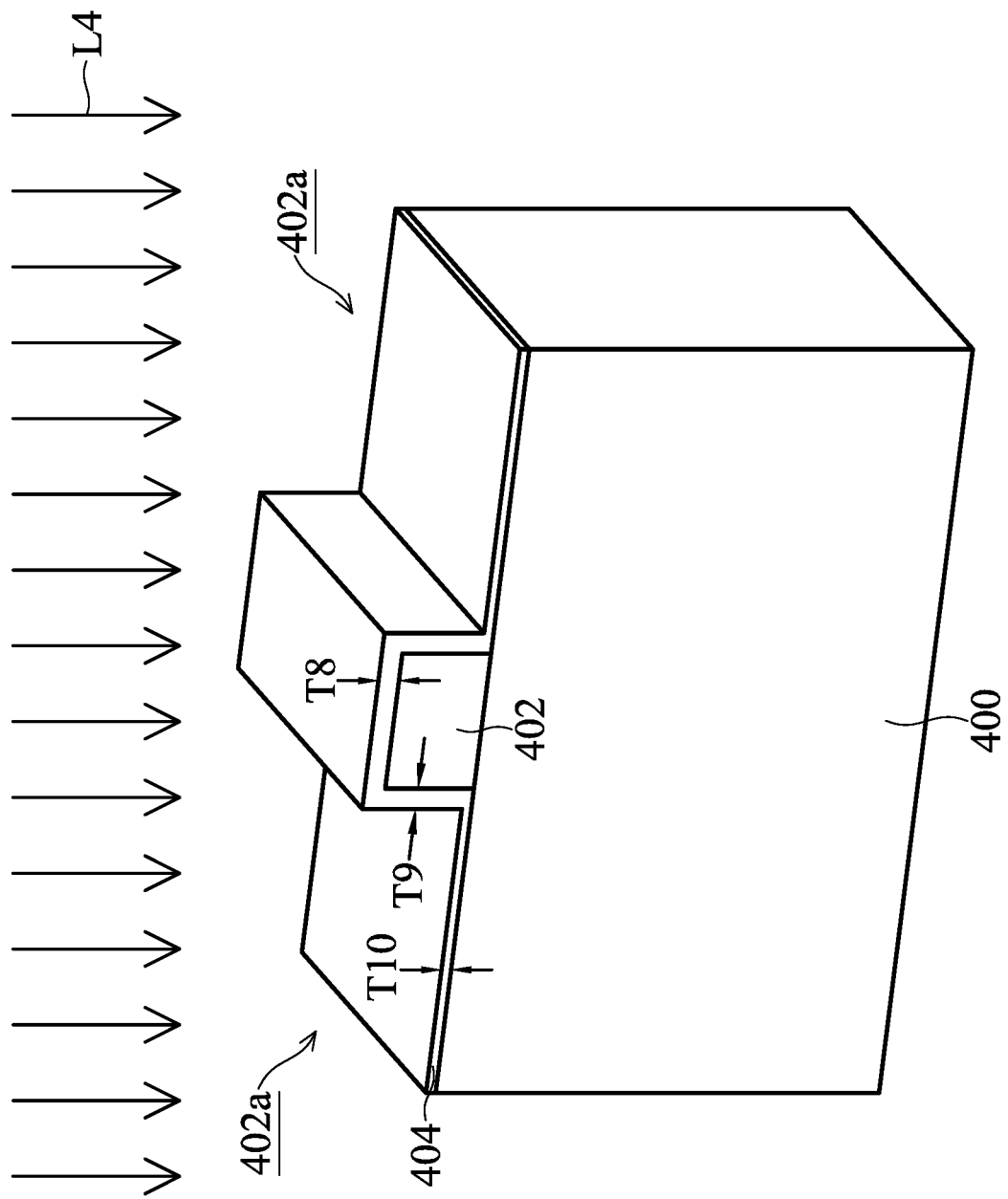
FIGS. 4A, 4B, 4C, 4D, 4E, 4F, 4G and 4H are a series of perspective views illustrating various stages of a method for forming a semiconductor structure in accordance with some embodiments.

A semiconductor substrate 400 is provided, as shown in FIG. 4A in accordance with some embodiments. The semiconductor substrate 400 may be the same as or similar to the semiconductor substrate 100 discussed above.

Afterwards a mask layer having a mask element 402 and openings 402a is formed on the semiconductor substrate 400, as shown in FIG. 4A in accordance with some embodiments. For example, the mask layer may be made of silicon nitride, silicon oxide, other applicable dielectric materials, or a combination thereof. For example, the mask layer may be formed by a deposition process (e.g., a chemical vapor deposition process), a patterning process (e.g., a lithographic process and an etching process), other applicable processes, or a combination thereof. In some embodiments, the mask layer and the semiconductor substrate 400 are made of different materials.

Afterwards, a layer 404 is formed on the mask element 402 and the semiconductor substrate 400, as shown in FIG. 4A in accordance with some embodiments. The layer 404 covers the top surface and the sidewalls of the mask element 402, and portions of the top surface of the semiconductor substrate 400 exposed by the openings 402a, as shown in FIG. 4A in accordance with some embodiments. In some embodiments, the layer 404 covers the top surface and the sidewalls of the mask element 402, and the portions of the top surface of the semiconductor substrate 400 exposed by the openings 402a are at least partially exposed by the layer 404.

The materials and the forming methods of the layer 404 may be the same as or similar to those of the third layer 106 discussed above. In the interests of simplicity, the details will not be discussed again.

Similar to the above embodiments, a laser beam L4 may be used to heat the semiconductor substrate 400 and the mask element 402 during the deposition of the layer 404, such that the thickness T8 of the layer 404 on the top surface of the mask element 402 and the thickness T9 of the layer 404 on the sidewalls of the mask element 402 are greater than the thickness T10 of the layer 404 on the portions of the top surface of the semiconductor substrate 400 exposed by the openings 402a, in accordance with some embodiments. Therefore, in these embodiments, the etch selectivity between the semiconductor substrate 400 and the mask element 402 in a subsequent etching process (e.g., an etching process for forming a fin structure) can be increased.

In some embodiments, a blocking layer (not shown in the figures) that is the same as or similar to the blocking layer 202 discussed above is formed on the portions of the top surface of the semiconductor substrate 400 exposed by the openings 402a before the deposition of the layer 404. Similarly, in these embodiments, the hydrophobicity of the top surface of the blocking layer is greater than the hydrophobicity of the top surface and sidewalls of the mask element 402, and thus the top surface of the blocking layer is at least partially exposed by the layer 404, increasing an etch selectivity between the semiconductor substrate 400 and the mask element 402 in a subsequent etching process (e.g., an etching process for forming a fin structure).

In some embodiments, a surface treatment that is the same as or similar to the surface treatment 302 discussed above is performed to modify the surface properties of the portions of the top surface of the semiconductor substrate 400 exposed by the openings 402a before the deposition of the layer 404. Similarly, in these embodiments, the hydrophobicity of the modified portions of the top surface of the semiconductor substrate 400 is greater than the hydrophobicity of the top surface and sidewalls of the mask element 402, and thus the modified portions of the top surface of the semiconductor substrate 400 is at least partially exposed by the layer 404, increasing an etch selectivity between the semiconductor substrate 400 and the mask element 402 in a subsequent etching process (e.g., an etching process for forming a fin structure).

Figure 4B:
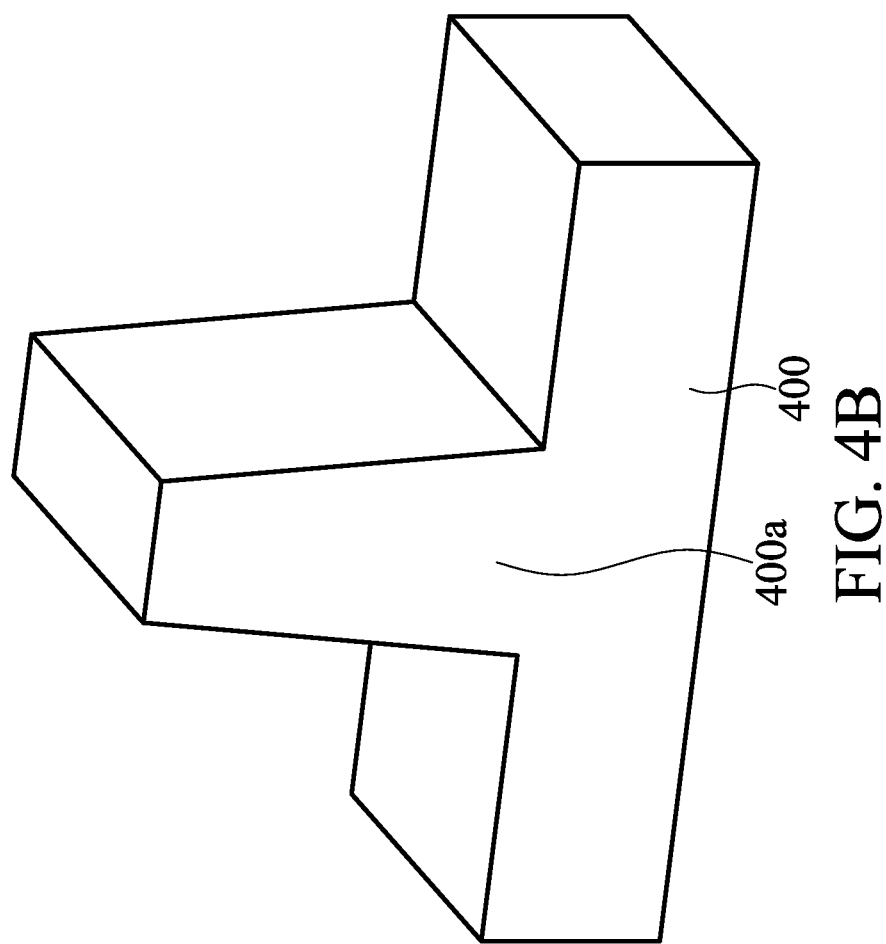

Afterwards, the semiconductor substrate 400 is etched to form a fin structure 400a, as shown in FIG. 4B in accordance with some embodiments. The mask layer having the mask element 402 and the openings 402a may be used as an etch mask in the etching process (e.g., a dry etching process, a wet etching process, or a combination thereof) for forming the fin structure 400a. For example, the dry etching process includes using a fluorine-based etchant gas, such as $SF_6$, $C_xF_y$, $NF_3$, or a combination thereof. The etching process may be a time-controlled process, and continue until the fin structure 400a reaches a predetermined height. The etching process also removes the layer 404 in accordance with some embodiments.

In some embodiments, the fin structure 400a has a width that gradually increases from the top portion to the lower portion, as shown in FIG. 4B. After the fin structure 400a is formed, the mask element 402 is removed by another etching process, as shown in FIG. 4B in accordance with some embodiments.

Figure 4C:
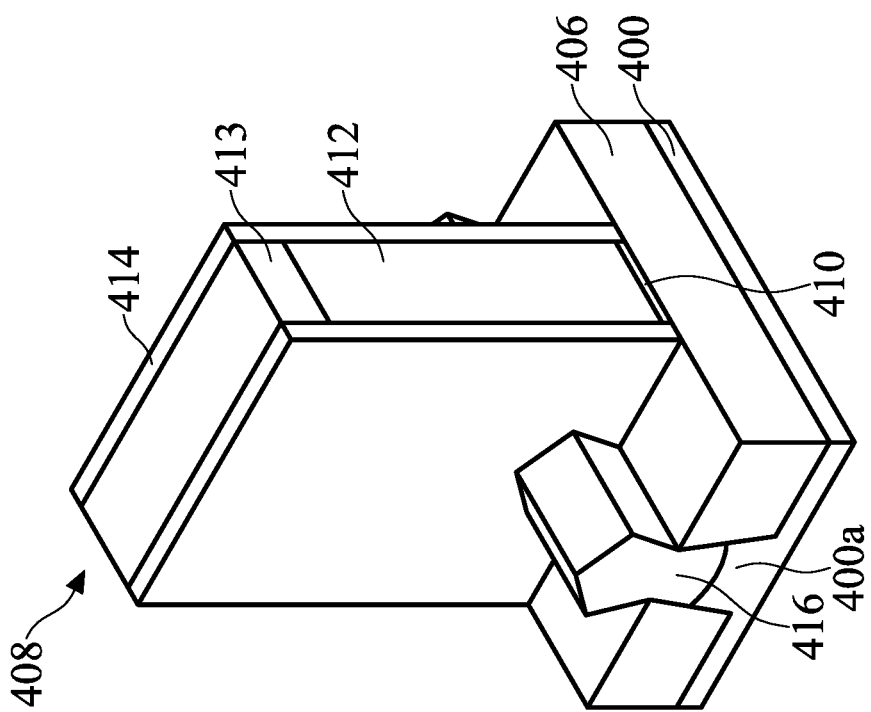

After the fin structure 400a is formed, an isolation structure 406 is formed over the substrate 400, and the fin structure 400a is surrounded by the isolation structure 406, as shown in FIG. 4C in accordance with some embodiments.

The isolation structure 406 may be formed by depositing an insulating layer over the substrate 400 and recessing the insulating layer. In some embodiments, the isolation structure 406 is made of silicon oxide, silicon nitride, silicon oxynitride, fluoride-doped silicate glass (FSG), other applicable dielectric materials, or a combination thereof.

Afterwards, a dummy gate structure 408 is formed across the fin structure 400a and extends over the isolation structure 406, as shown in FIG. 4C in accordance with some embodiments. The dummy gate structure 408 may include a dummy gate dielectric layer 410, a dummy gate electrode layer 412, and a capping layer 413.

The dummy gate dielectric layer 410 may be made of silicon oxide, other applicable dielectric materials, or a combination thereof. The dummy gate electrode layer 412 may be made of poly-silicon, or other applicable materials. The capping layer 413 may be made of silicon nitride, or other applicable materials. The dummy gate dielectric layer 410, the dummy gate electrode layer 412, and the capping layer 413 may be formed by suitable deposition processes (e.g., chemical vapor deposition process, and physical vapor deposition process).

After the dummy gate structure 408 is formed, spacers 414 are formed on sidewalls of the dummy gate structure 408, as shown in FIG. 4C in accordance with some embodiments. In some embodiments, the spacers 414 are made of silicon nitride, silicon oxide, other applicable materials, or a combination thereof. In some embodiments, the spacers 414 are formed by a deposition process (e.g., a chemical vapor deposition process) followed by an anisotropic etching process.

Afterwards, source/drain (S/D) structures 416 are formed over and/or in the fin structure 400a. In some embodiments, portions of the fin structure 400a adjacent to the dummy gate structures 408 are recessed to form recesses, and a strained material is grown in the recesses by an epitaxial (epi) process to form the S/D structures 416. In addition, the lattice constant of the strained material may be different from the lattice constant of the semiconductor substrate 400. In some embodiments, the S/D structures 416 include Si, Ge, SiGe, InAs, InGaAs, InSb, GaAs, GaSb, InAlP, InP, other applicable materials, or a combination thereof.

Figure 4D:
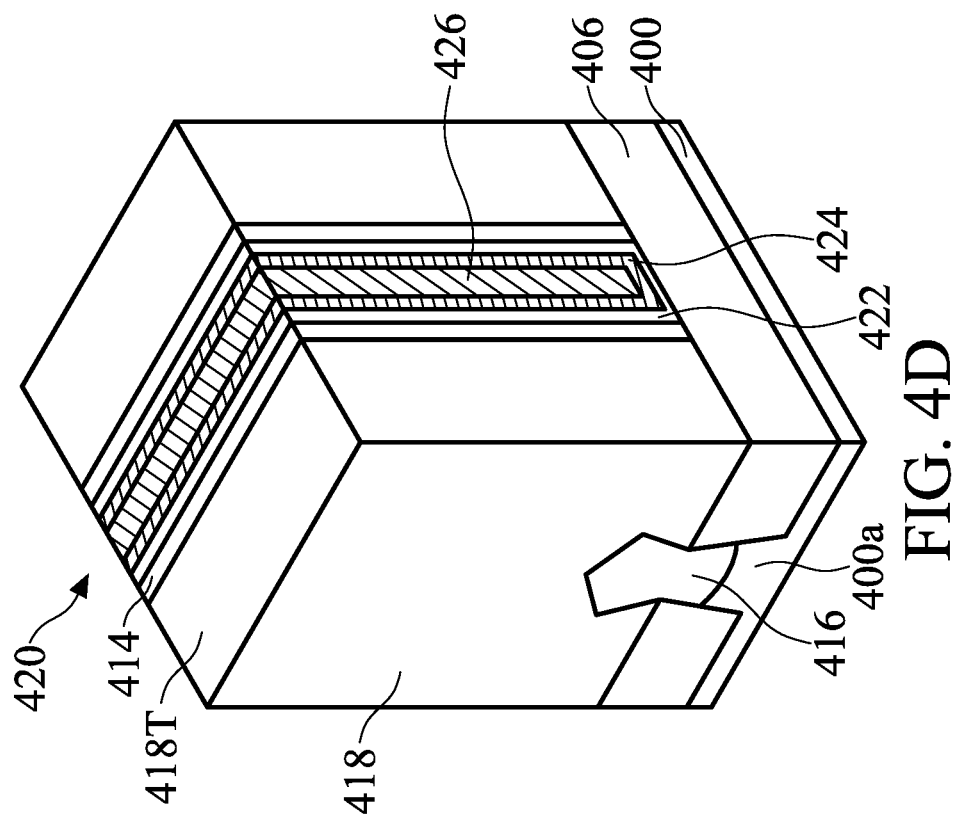

After the source/drain structures 416 are formed, an interlayer dielectric (ILD) layer 418 is formed over semiconductor substrate 400 and the fin structure 400a, as shown in FIG. 4D in accordance with some embodiments. The materials and the forming methods of the ILD layer 418 may be the same as or similar to those of the first layer 102 discussed above, and the details will not be discussed again.

Afterwards, the dummy gate structure 408 is replaced by a metal gate structure 420, as shown in FIG. 4D in accordance with some embodiments. In some embodiments, the metal gate structure 420 includes a gate dielectric layer 422, a work function metal layer 424 on the gate dielectric layer 422, and a gate electrode layer 426 on the work function metal layer 424.

In some embodiments, the gate dielectric layer 422 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. For example, the gate dielectric layer 422 may be formed by a chemical vapor deposition process, an atomic layer deposition process, other applicable processes, or a combination thereof.

The work function metal layer 424 may be made of tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), other applicable materials or a combination thereof. For example, the work function metal layer 424 may be formed by a physical vapor deposition process or another applicable deposition process.

The gate electrode layer 426 may be made of tungsten, titanium, aluminum, copper, molybdenum, nickel, platinum, another applicable conductive material, or a combination thereof. For example, the gate electrode layer 426 may be formed by a physical vapor deposition process or another applicable deposition process.

Figure 4E:
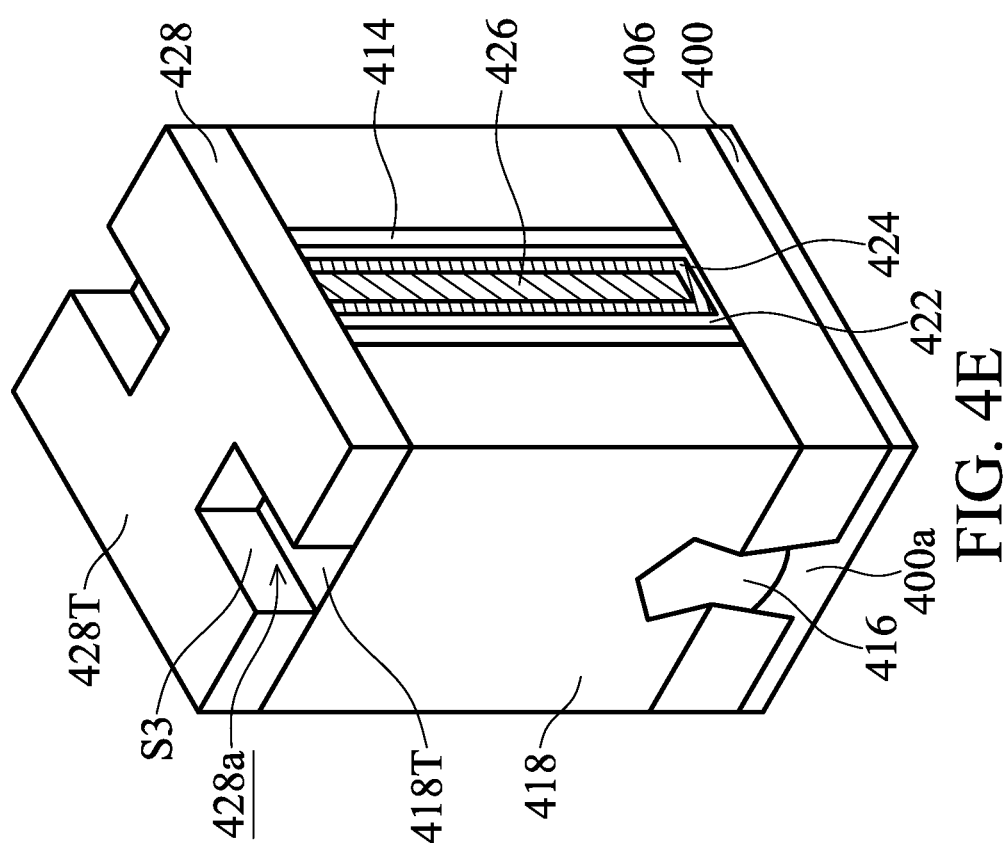

Afterwards, a mask layer 428 having openings 428a is formed on a top surface 418T of the ILD layer 418, as shown in FIG. 4E in accordance with some embodiments. The materials and the forming methods of the mask layer 428 may be the same as or similar to those of the second layer 104 discussed above, and the details will not be discussed again. In some embodiments, the mask layer 428 and the ILD layer 418 are made of different dielectric materials.

In some embodiments, the opening 428a of the mask layer 428 exposes a portion of the top surface 418T of the ILD layer 418. The opening 428a may have sidewalls S3, as shown in FIG. 4E, and the sidewalls S3 may also be considered as the sidewalls of the mask layer 428.

Figure 4F:
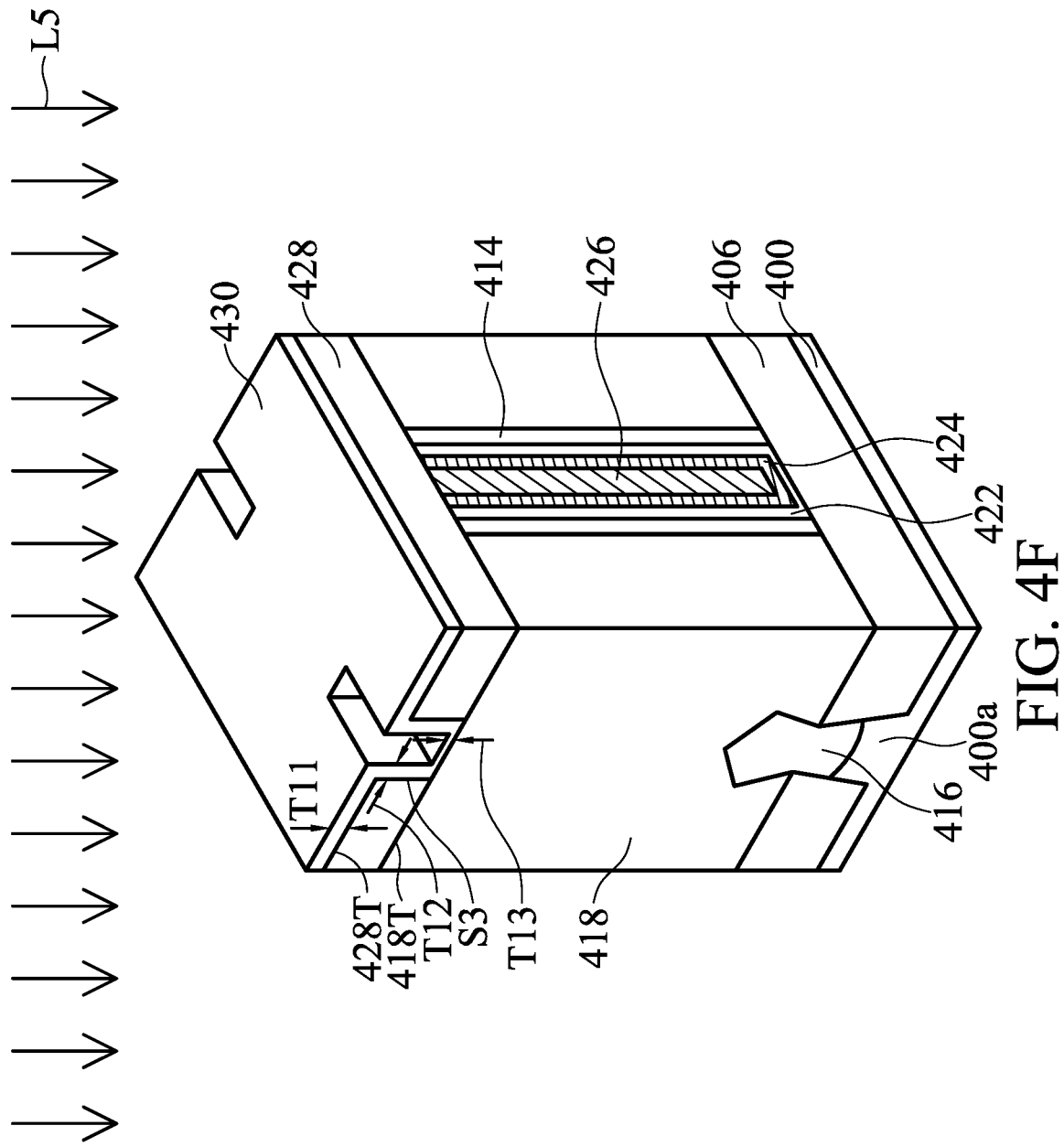

Afterwards, a layer 430 is formed on the mask layer 428 and ILD layer 418, as shown in FIG. 4F in accordance with some embodiments. The layer 430 covers a top surface 428T and the sidewalls S3 of the mask layer 428, and the portion of the top surface 418T exposed by the opening 428a, as shown in FIG. 4F in accordance with some embodiments. In some embodiments, the layer 430 covers the top surface 428T and the sidewalls S3 of the mask layer 428, and the portion of the top surface 418T exposed by the openings 428a is at least partially exposed by the layer 430.

The materials and the forming methods of the layer 430 may be the same as or similar to those of the third layer 106 discussed above. In the interests of simplicity, the details will not be discussed again.

Similar to the above embodiments, a laser beam L5 is used to heat the ILD layer 418 and the mask layer 428 during the deposition of the layer 430, such that the thickness T11 of the layer 430 on the top surface 428T of the mask layer 428 and the thickness T12 of the layer 430 on the sidewall S3 of the mask layer 428 are greater than the thickness T13 of the layer 430 on the portion of the top surface 418T of ILD layer 418 exposed by the opening 428a, in accordance with some embodiments. Therefore, in these embodiments, an etch selectivity of ILD layer 418 and the mask layer 428 in a subsequent etching process (e.g., an etching process for forming a contact hole) can be increased.

In some embodiments, a blocking layer (not shown in the figures) that is the same as or similar to the blocking layer 202 discussed above is formed on the portion of the top surface 418T of ILD layer 418 exposed by the opening 428a before the deposition of the layer 430. Similarly, in these embodiments, the hydrophobicity of the top surface of the blocking layer is greater than the hydrophobicity of the top surface 428T and sidewalls S3 of the mask layer 428, and thus the top surface of the blocking layer is at least partially exposed by the layer 430, increasing an etch selectivity of ILD layer 418 and the mask layer 428 in a subsequent etching process (e.g., an etching process for forming a contact hole).

In some embodiments, a surface treatment that is the same as or similar to the surface treatment 302 discussed above is performed to modify the surface properties of the portion of the top surface 418T of ILD layer 418 exposed by the opening 428a before the deposition of the layer 430. Similarly, in these embodiments, the hydrophobicity of the modified portion of the top surface 418T of ILD layer 418 is greater than the hydrophobicity of the top surface 428T and sidewalls S3 of the mask layer 428, and thus the modified portion of the top surface 418T of ILD layer 418 is at least partially exposed by the layer 430, increasing an etch selectivity of ILD layer 418 and the mask layer 428 in a subsequent etching process (e.g., an etching process for forming a contact hole).

Figure 4G:
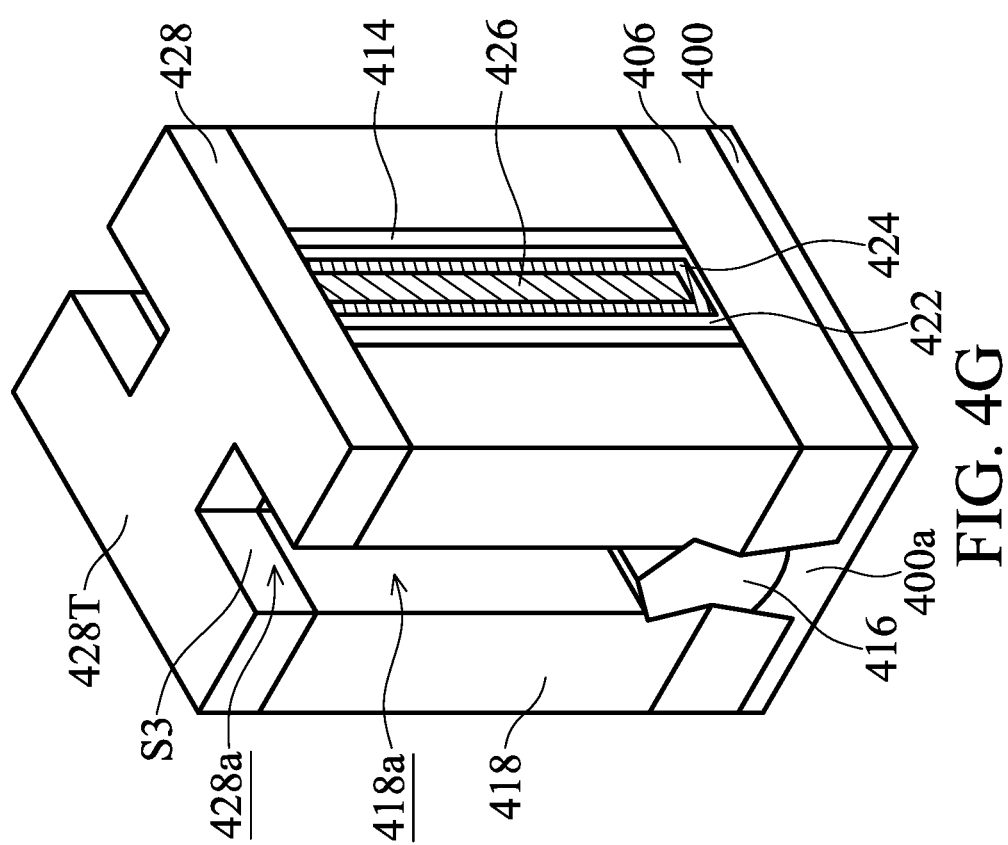

Afterwards, the ILD layer 418 is etched to form contact holes 418a in the ILD layer 418, as shown in FIG. 4G in accordance with some embodiments. The S/D structures 416 are at least partially exposed by the contact holes 418a in the ILD layer 418, as shown in FIG. 4G in accordance with some embodiments.

The contact holes 418a are formed in an etching process, in accordance with some embodiments. The etching process may be a dry etching process, a wet etching process, or a combination thereof. The mask layer 428 may be used as an etch mask in the etching process. The layer 430 and portions of the ILD layer 418 exposed by the openings 428a are removed by the etching process to form the contact holes 418a in the ILD layer 418, in accordance with some embodiments. Afterwards, another etching process may be performed to remove the mask layer 428.

Figure 4H:
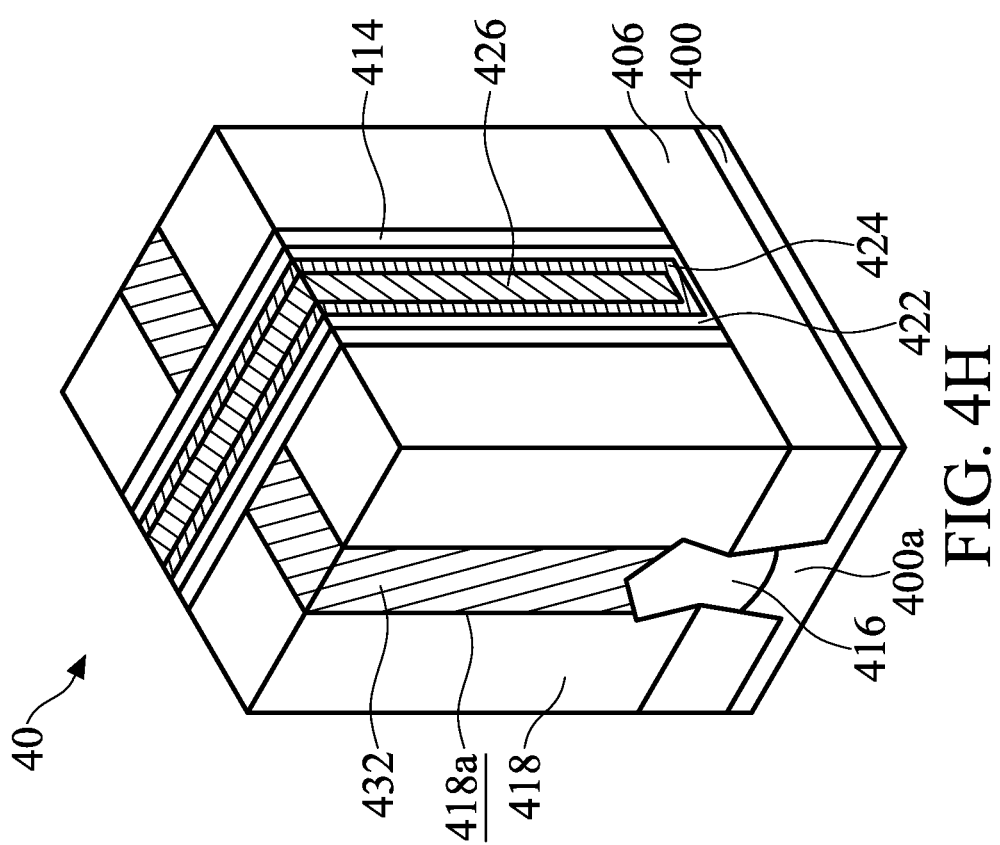

Afterwards, source/drain contacts 432 are formed in the contact holes 418a to form a semiconductor structure 40, as shown in FIG. 4H in accordance with some embodiments. In some embodiments, the contact holes 418a are filled with a conductive material to form the source/drain contacts 432 in the contact holes 418a. For example, the conductive material of the source/drain contact 432 may be tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or a combination thereof. A physical vapor deposition process, an atomic layer deposition process, a plating process, a chemical vapor deposition process, or other applicable processes may be used to deposit the conductive material, and then the conductive material outside the contact holes 418a may be removed by an applicable process (e.g., a chemical mechanical polishing process) while the conductive material inside the contact holes 418a may be left to serve as the source/drain contacts 432.

As described previously, during the deposition of the third layer 106, the first layer 102 is heated by the laser beam L1 to the first temperature A1, and the second layer 104 is heated by the laser beam L1 to the second temperature A2, which is higher than the first temperature A1. Therefore, the thickness T1 of the third layer 106 on the top surface 104T of the second layer 104 and the thickness T2 of the third layer 106 on the sidewall S1 of the second layer 104 are greater than the thickness T3 of the third layer 106 on the portion of the top surface 102T of first layer 102 exposed by the first opening 104a. Therefore, the etch selectivity between the first layer 102 and the second layer 104 in the etching process for forming the opening 102a (e.g., a contact hole) can be increased.

Embodiments of methods for forming semiconductor structures are provided. The method for forming semiconductor structure may include forming a first layer and a second layer on a semiconductor substrate. The first layer and the second layer may be made of different materials. The method may also include heating the first layer and the second layer with a laser beam, and forming a third layer over the first layer and the second layer. The formation of the third layer over the first layer and the second layer may be affected by the heating of the first layer and the second layer, and the etch selectivity between the first layer and the second layer in a subsequent etching process may therefore be improved.

In some embodiments, a method for forming a semiconductor structure is provided. The method includes forming a first layer over a semiconductor substrate. The first layer is made of a first material. The method also includes forming a second layer over the first layer. The second layer is made of a second material that is different from the first material. The second layer has a first opening exposing a portion of a top surface of the first layer. The method also includes heating the first layer and the second layer using a laser beam, depositing a third layer over the second layer and covering a sidewall of the first opening, and etching the first layer through the first opening to form a second opening in the first layer.

In some embodiments, a method for forming a semiconductor structure is provided. The method includes forming a first dielectric layer on a semiconductor substrate, and forming a second dielectric layer on the first dielectric layer. The first dielectric layer and the second dielectric layer are made of different dielectric materials. A portion of a top surface of the first dielectric layer is exposed by the second dielectric layer. The method also includes depositing a third dielectric layer on a top surface and a sidewall of the second dielectric layer by an atomic layer deposition process in a chamber while heating the first dielectric layer and the second dielectric layer using a laser beam in the chamber, and etching the first dielectric layer in the chamber to form an opening in the first dielectric layer.

In some embodiments, a method for forming a semiconductor structure is provided. The method includes forming a first dielectric layer on a semiconductor substrate, and forming a mask layer on the first dielectric layer. The mask layer and the first dielectric layer are made of different dielectric materials. The mask layer has an opening exposing a portion of a top surface of the first dielectric layer. The method also includes depositing a second dielectric layer on the mask layer and covering a sidewall of the opening in a chamber. The first dielectric layer and the mask layer are heated with a laser beam in the chamber during the deposition of the second dielectric layer. A laser absorption coefficient of the mask layer with respect to the laser beam is greater than a laser absorption coefficient of the first dielectric layer with respect to the laser beam. The method also includes etching the first dielectric layer through the opening in the chamber to form a contact hole, and forming a contact in the contact hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a first layer over a semiconductor substrate, wherein the first layer is made of a first material;
    forming a second layer over the first layer, wherein the second layer is made of a second material that is different from the first material, and the second layer has a first opening exposing a portion of a top surface of the first layer;
    heating the first layer and the second layer with a laser beam, wherein the laser beam heats the first layer to a first temperature, and the laser beam heats the second layer to a second temperature that is different from the first temperature;
    depositing a third layer over the second layer and covering a sidewall of the first opening; and
    etching the first layer through the first opening to form a second opening in the first layer.

2. The method for forming a semiconductor structure as claimed in claim 1, wherein a laser absorption coefficient of the first material with respect to the laser beam is different from a laser absorption coefficient of the second material with respect to the laser beam.

3. The method for forming a semiconductor structure as claimed in claim wherein the laser absorption coefficient of the second material with respect to the laser beam is greater than the laser absorption coefficient of the first material with respect to the laser beam.

4. The method for forming a semiconductor structure as claimed in claim 1, wherein the second temperature is higher than the first temperature.

5. The method for forming a semiconductor structure as claimed in claim 4, wherein a difference between the second temperature and the first temperature is in a range from about 100° C. to about 300° C.

6. The method for forming a semiconductor structure as claimed in claim 1, wherein a growth rate of the third layer on a top surface of the second layer is greater than a growth rate of the third layer on the portion of the top surface of the first layer.

7. The method for forming a semiconductor structure as claimed in claim 1, wherein a first thickness of the third layer outside the first opening and on a top surface of the second layer is greater than a second thickness of the third layer inside the first opening and on the portion of the top surface of the first layer.

8. The method for forming a semiconductor structure as claimed in claim 1, wherein the third layer is deposited using an atomic layer deposition process.

9. The method for forming a semiconductor structure as claimed in claim 1, further comprising:
forming a blocking layer over the portion of the top surface of the first layer before the deposition of the third layer, wherein a hydrophobicity of a top surface of the blocking layer is greater than a hydrophobicity of a top surface of the second layer.

10. The method for forming a semiconductor structure as claimed in claim 1, further comprising:
applying a plasma on the portion of the top surface of the first layer to increase a hydrophobicity of the portion of the top surface of the first layer before the deposition of the third layer.

11. The method for forming a semiconductor structure as claimed in claim 1, further comprising:
forming a fin structure on the semiconductor substrate, forming a gate structure on the fin structure;
forming a source/drain structure on the fin structure and adjacent to the gate structure, wherein the source/drain structure and the gate structure are surrounded by the first layer, and the second opening exposes the source/drain structure; and
filling the second opening with a conductive material.

12. The method for forming a semiconductor structure as claimed in claim 1, wherein the third layer is removed during etching the first layer through the first opening to form the second opening in the first layer.

13. A method for forming a semiconductor structure, comprising:
forming a first dielectric layer on a semiconductor substrate;
forming a second dielectric layer on the first dielectric layer, wherein the first dielectric layer and the second dielectric layer are made of different dielectric materials, and a portion of a top surface of the first dielectric layer is exposed by the second dielectric layer;
depositing a third dielectric layer on a top surface and a sidewall of the second dielectric layer by an atomic layer deposition process in a chamber while heating the first dielectric layer and the second dielectric layer with a laser beam in the chamber; and
etching the first dielectric layer in the chamber to form an opening in the first dielectric layer.

14. The method for forming a semiconductor structure as claimed in claim 13, wherein the second dielectric layer is heated to a temperature using the laser beam, and the temperature is in a range from about 200° C. to about 600° C.

15. The method for forming a semiconductor structure as claimed in claim 13, wherein a laser absorption coefficient of the second dielectric layer with respect to the laser beam is greater than a laser absorption coefficient of the first dielectric layer with respect to the laser beam.

16. The method for forming a semiconductor structure as claimed in claim 13, wherein the laser beam heats the first dielectric layer to a first temperature, and the laser beam heats the second dielectric layer to a second temperature which is higher than the first temperature.

17. The method for forming a semiconductor structure as claimed in claim 16, further comprising:
forming a fin structure on the semiconductor substrate;
forming a gate structure on the fin structure;
forming a source/drain structure in the fin structure and adjacent to the gate structure, wherein the source/drain structure is covered by the first dielectric layer, and the source/drain structure is exposed by the opening; and
filling the opening with a conductive material to form a source/drain contact.

18. A method for forming a semiconductor structure, comprising:
forming a first dielectric layer on a semiconductor substrate;
forming a mask layer on the first dielectric layer, wherein the mask layer and the first dielectric layer are made of different dielectric materials, and the mask layer has an opening exposing a portion of a top surface of the first dielectric layer;
depositing a second dielectric layer on the mask layer and covering a sidewall of the opening in a chamber, wherein the first dielectric layer and the mask layer heated with a laser beam in the chamber during the deposition of the second dielectric layer, and wherein a laser absorption coefficient of the mask layer with respect to the laser beam is greater than a laser absorption coefficient of the first dielectric layer with respect to the laser beam; and
etching the first dielectric layer through the opening in the chamber to form a contact hole; and
forming a contact in the contact hole.

19. The method for forming a semiconductor structure as claimed in claim 18, wherein a first thickness of the second dielectric layer on a top surface of the mask layer is greater than a second thickness of the second dielectric layer on the portion of the top surface of the first layer.

20. The method for forming a semiconductor structure as claimed in claim 18, wherein etching the first dielectric layer through the opening in the chamber to form the contact hole after depositing the second dielectric layer.

* * * * *